(12) United States Patent
Alley

(10) Patent No.: US 8,273,251 B2
(45) Date of Patent: Sep. 25, 2012

(54) USE OF ELECTROMAGNETIC PULSES IN CROSS-FLOW FILTRATION SYSTEMS

(75) Inventor: David Wayne Alley, Haddam, CT (US)

(73) Assignee: Clearwater Systems Corporation, Middletown, CT (US)

( * ) Notice: Subject to any disclaimer, the term of this patent is extended or adjusted under 35 U.S.C. 154(b) by 1388 days.

(21) Appl. No.: 11/900,094

(22) Filed: Sep. 7, 2007

(65) Prior Publication Data

US 2009/0065444 A1    Mar. 12, 2009

(51) Int. Cl.
*B01D 17/06* (2006.01)

(52) U.S. Cl. ............... 210/748.01; 422/22; 422/186; 422/186.3; 204/155; 204/157.15; 204/542; 210/641; 210/650

(58) Field of Classification Search .. 210/748.01–748.2, 210/641, 650, 630, 809, 243, 202, 201, 192, 210/203, 8, 90, 96.2, 104, 105, 108, 134, 210/138, 141, 143, 256, 195.2, 195.1, 121, 210/695, 177, 609, 651, 652, 259, 175, 805, 210/900; 422/22, 24, 186.3, 20, 186; 204/627–640, 204/518–544, 554, 557, 571, 660, 661, 157.15
See application file for complete search history.

(56) References Cited

U.S. PATENT DOCUMENTS

| | | | |
|---|---|---|---|
| 6,001,244 A * | 12/1999 | Salter et al. | 210/104 |
| 6,521,134 B1 | 2/2003 | Banerjee et al. | |
| 7,524,423 B2 | 4/2009 | Wittmer et al. | |
| 2002/0148761 A1 * | 10/2002 | Siriphraiwan | 210/96.1 |
| 2005/0211638 A1 * | 9/2005 | Schrive et al. | 210/748 |

FOREIGN PATENT DOCUMENTS

| | | |
|---|---|---|
| CA | 2112600 | 12/1993 |
| WO | 98/31637 | 7/1998 |
| WO | 00/03781 | 1/2000 |
| WO | 2006/062784 | 6/2006 |

OTHER PUBLICATIONS

Baker, J.S. et. al. Antiscale Magnetic Pretreatment of Reverse Osmosis Feedwater, The International Journal on the Science and Technology of Desalting and Water Purification, Aug. 1997, 151-166, vol. 110, Elsevier, Amsterdam.

(Continued)

*Primary Examiner* — Joseph Drodge
*Assistant Examiner* — Cameron J Allen
(74) *Attorney, Agent, or Firm* — Michaud-Kinney Group LLP

(57) ABSTRACT

A fluid feed stream is flowed, subject to electromagnetic pulses, to a filter element via an input feed conduit for the filter element. A coil assembly is disposed about the input feed conduit and an AC power source is connected with the coil assembly. The AC power source has a period including first and second half-cycles of opposing polarities. A switch in series with the coil assembly forms a series connected circuit. A second switch connected with the coil assembly forms a second circuit. A control means closes the first switch and opens the second switch during a first half-cycle of the AC power source. During a second half-cycle, the control means closes and then opens the second switch to produce a first large ringing pulse in the coil assembly. A subsequent pulse may be produced either before or after the first pulse substantially decays.

25 Claims, 5 Drawing Sheets

OTHER PUBLICATIONS

Corbett, Brent E., et al, Evaluation of Reverse Osmosis Scaling Prevention Devices at High Recovery, U.S. Dept of the Interior Report, Mar. 2003, 1-35, Report No. 91, National Technical Information Service, Operations Division, Springfield VA.

Nanyu, Yang, Physical Conditioning for Scale Prevention during Desalination by Reverse Osmosis, Master Thesis, 2005, 1-60, Dept. of Civil Enviromental Engineering, Water Environment Transport, Chalmers University of Technology, Göteborg, Sweden.

Coster, Hans G. L., The Effects of Alternating Electromagnetic Fields in the Context of the GrahamTek Membrane Modules, Technical Paper, 2006, 1-16, GrahamTek Systems (Pty) Ltd. Strand, South Africa.

Fane, Tony, Effect of EMF and Bubbles on Deposit Fouling in RO Tester, Technical Paper, 2007, 1-16, GrahamTek Systems (Pty) Ltd., Strand, South Africa.

Li, Jianxin, et al, Quantitative Study of the Effect of Electromagnetic Field on Scale Deposition on Nanofiltration Membranes via UTDR, Journal-Water Research, Jun. 2007, 4595-4610, vol. 41, Elsevier, Amsterdam.

International Search Report for PCT/US2008/074549, dated Dec. 17, 2008.

* cited by examiner

USE OF ELECTROMAGNETIC PULSES IN CROSS-FLOW FILTRATION SYSTEMS

FIELD OF THE INVENTION

This invention relates to filtration systems and, in particular, to cross-flow filtration systems.

BACKGROUND

Filtration is a process in which contaminants in a fluid such as water, for example, particulate matter and, in some cases, dissolved species, are removed from the fluid by flowing the contaminated fluid through a filter membrane. Filtration exists in two basic forms, dead-end filtration or cross-flow filtration. The defining aspect of dead-end filtration is that all of the liquid fed to the filter membrane (the "feed stream") must pass through the filter membrane and all the filtered material must be retained by the filter membrane. A drip-type coffee maker, in which ground coffee is placed in a basket which has been lined with a filter membrane of porous paper, provides an example of dead-end particulate filtration. Hot water is poured onto the coffee grounds in the basket to constitute a feed stream for the filter. As the water passes through the coffee grounds, it dissolves the soluble components of the coffee grounds. The water and the soluble components therein pass through the filter membrane, while the insoluble components of the coffee remain in particulate form and are retained by the filter membrane. Filtration of this type has practical limits on the size of the particulate matter which can be removed and the amount of power (alternatively, rate of filtration) required to process a given amount of feed stream material.

Cross-flow filtration differs from dead-end filtration in that not all the fluid of the feed stream passes through the filter membrane and not all the contaminants are retained on the filter membrane. In cross-flow filtration, the feed stream of contaminated fluid is flowed along a surface of a filter membrane that is permeable to the fluid but impermeable to one or more contaminants in the fluid. Some of the fluid passes through the filter membrane, which removes some of the contaminants so that the fluid that emerges is purified. This purified fluid is called "permeate" or "product". The remaining fluid by-passes the filter membrane, carrying contaminants with it, and exits without being filtered. This material is called "retentate" or "reject" or "concentrate." The continual motion of fluid across the surface of the filter membrane causes some of the contaminant material to be removed from the filter membrane and to exit with the reject. The filter membrane is normally packaged in a flow-through vessel to provide a filter element to which a feed stream is provided and from which permeate and retentate are collected.

Cross-flow filtration can be used to filter smaller particles than is practical with dead-end filtration. Four general classes of cross-flow filtration are known in the art: microfiltration, ultrafiltration, nanofiltration and reverse osmosis. Each of these classes of filtration makes use of a semi-permeable filter membrane (sometimes also referred to herein simply as a "filter" or as a "membrane"). Cross-flow filter membranes are sometimes classified as low-pressure membranes (which include microfiltration membranes and ultrafiltration membranes) and high-pressure membranes (which include nanofiltration membranes and reverse osmosis membranes). Low-pressure membranes filter particulates including organisms such as bacteria and viruses. Nanofiltration membranes filter particulates and some larger ions. Reverse osmosis membranes filter particulates and a wider range of ions than does nanofiltration.

Each form of cross-flow filtration suffers from one or more problems which limit productivity. The "flux," or productivity, of a membrane, i.e, the volume of water which may be processed by a membrane, decreases with increasing fouling. Fouling may consist of inorganic/scale, particulate/colloidal, microbial, or organic deposits that accumulate on the membrane. The productivity of a low-pressure membrane is limited by two primary factors, the growth of biological material (biofilm) on the membrane and the filterability of particulate matter. The filterability of the particulate matter is a function of the size of the particles and the degree to which they deform or pack as they are filtered. Large, hard, non-deforming particles are more easily retained by most filters without clogging than are small, sticky particles. In general, biofilm is the result of bacterial growth on surfaces, including the surfaces of filter membranes. A common problem for low-pressure membranes is that the fluid to be filtered (commonly, water) contains both bacteria and nutrients for the bacteria. The bacteria settle on the membrane and secrete a polysaccharide binder or glue. The presence of this film significantly reduces the permeability of the biologically coated membrane. Low-pressure membranes can be backwashed if they become clogged with particulates or similar contaminants.

Typically, a high-pressure membrane is mounted on, and wound around, a perforated product collection tube. The wound membrane-product collection tube assembly is mounted in a pressure vessel to yield a filter element. The pressure vessel has an input where a feed stream is flowed under pressure into contact with the membrane, and two outputs, one output being the product collection tube (where permeate is collected) and the other being a collection tube for fluid containing the contaminants that did not pass through the membrane (where retentate is collected). The filter element is constructed such that only the permeate can enter the product collection tube.

Most high-pressure membranes are packaged (wound) so that the spaces through which the fluid to be filtered must pass are very small. In addition, high-pressure membranes cannot be backwashed and must be protected from most if not all particulate matter by pretreatment steps. For example, it is common practice to provide pretreatment of feed stream water in a reverse osmosis system, to remove most of the particulate matter before the water passes to the reverse osmosis filter element. The pretreatment can be in the form of conventional filtration (sand filter, coagulant addition, settling) or in the form of a low-pressure membrane (with the inherent limitations described above). Pretreatment for a reverse osmosis system may also include pH regulation of the feed stream.

Despite such pretreatment, high-pressure membranes have performance limiting problems. The two primary fouling problems for high-pressure membranes are biofilm and scaling. The biofilm problem is as previously described for low-pressure membranes. Addressing biological problems in high-pressure membranes are more difficult than it is in low-pressure membranes because the spaces in which the biofilm grows are smaller, making plugging with live or dead bacteria more of a concern, and because high-pressure membranes are quite sensitive to biocides such as chlorine.

Scaling is a problem which can occur in nanofiltration membranes but which is much more prevalent in reverse osmosis membranes. In the process of reverse osmosis, water containing some very fine particulates and ions (e.g., $Ca^{+2}$, $Na^+$, $Mg^{+2}$, $Cl^-$, $CO_3^{-2}$, $SO_4^{-2}$) is passed along a first side of a membrane. As the feed stream water to be filtered passes along the membrane, some of the feed stream passes through the membrane and is emitted from a second side of the membrane as pure water (i.e., water that is substantially free of ions). This process causes the ions which remain on the first side of the membrane to increase in concentration in the remaining water, generating retentate. If sufficient water is allowed to pass through the membrane, the remaining solution (the retentate) will reach saturation for some of the ions present and minerals (e.g., $CaCO_3$ and or $CaSO_4$) will precipitate. This precipitate will inhibit, and may preclude, the further passage of water through the membrane. The need to avoid scaling limits the percentage of pure water which can be recovered from the feed stream.

A typical reverse osmosis filter element will yield about 50% permeate liquid, and 50% concentrate liquid. For example, if 100 gallons per minute (GPM) of liquid is fed into a reverse osmosis system, approximately 50 GPM of permeate will be output, and 50 GPM of concentrate or retentate will also be output.

A reverse osmosis system may have several stages wherein the retentate from one filter element (the first stage) is processed by a subsequent filter element (a second stage), and so on. In general, a maximum recovery from the initial feed stream is about 85% converted to permeate. Accordingly, when 100 million gallons of feed liquid is processed through the stages of a reverse osmosis system, approximately 15 million gallons of retentate will be generated and must be properly disposed of.

As noted above, after a period of operation, a reverse osmosis membrane can become fouled with mineral scale and/or bacteria that diminish the filtration performance of the membrane. Bacteria contribute to the formation of a biofilm that further diminishes the performance of the membrane. Typically, when a membrane in a reverse osmosis system becomes fouled to an unacceptable level, the membrane must be removed from use to be cleaned. However, each time a membrane is cleaned, its effectiveness and production capacity is reduced.

SUMMARY OF THE INVENTION

The present invention resides in one aspect in a method of treating a liquid feed stream by flowing the feed stream to a cross-flow system comprising a first filter element, to yield a first permeate and a first retentate, and subjecting the feed stream to electromagnetic pulses. In a particular embodiment, the invention is practiced on the feed stream of a reverse osmosis filtration process.

The present invention resides in another aspect in an improvement to a cross-flow filtration system comprising a filter element having an input feed pipe for receiving a flow of feed stream fluid. The filter element yields a flow of permeate and a flow of retentate. The improvement comprises a coil assembly disposed about the input feed pipe, for subjecting the feed stream to electromagnetic pulses.

In a particular embodiment, the coil assembly includes an AC power source. The AC power source has a period including a first half-cycle of one polarity and a second half cycle of a polarity opposite to that of the first half-cycle. There is a first switch connected in series with the coil assembly to form a series connected circuit, and a second switch connected with the coil assembly to form a second circuit. There is also a control means for the first switch. The control means is configured to close the first switch and open the second switch during a first half-cycle of the AC power source period and, during a second half-cycle, to perform a subroutine of closing and then opening the second switch to produce at least a first large ringing pulse in the coil assembly.

Optionally, before the first large ringing pulse substantially decays, the control means closes and opens the second switch to produce a second large ringing pulse. Alternatively, the control means produces a second large ringing pulse after the first large ringing pulse substantially decays.

The electromagnetic pulses will aid in minimizing fouling of membranes which constitute part of a cross-flow filtration system.

DETAILED DESCRIPTION OF THE INVENTION

Figure 1:
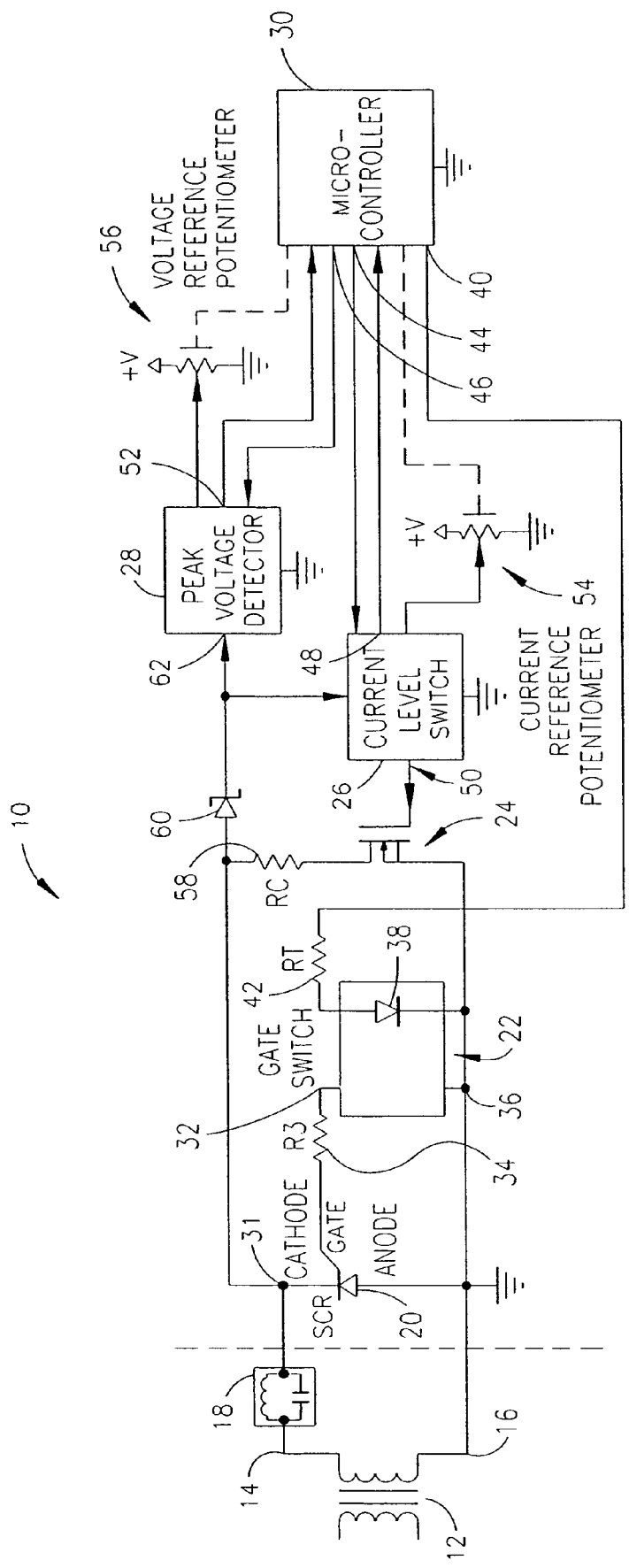
FIG. 1 is a schematic circuit diagram of an apparatus for generating a ringing electromagnetic pulse for treating flowing liquid in accordance with the invention.

A cross-flow filtration system is improved by flowing a feed stream of contaminated fluid to a cross-flow filter element, and subjecting the feed stream to pulses of electromagnetic radiation as described herein. As a result of such treatment, fouling of the filter membrane in the filter element will be diminished, and the operational output of the filter membrane and its useful life will be extended. Thus, electromagnetic pulse treatment as described herein improves efficiency and reduces costs associated with membrane cleaning and replacement. As used herein, the term "feed stream" refers to a stream of fluid that is flowed into a first side of a filter membrane so that fluid may pass through the filter membrane and be released from the second side to yield permeate. The invention can be practiced with a cross-flow filter element for any kind of cross-flow filtration: microfiltration, ultrafiltration, nanofiltration, or reverse osmosis.

The invention may be employed in cross-flow filtration systems configured to provide multiple stages of filter elements in successive staged relation to each other. In such systems, an initial feed stream of contaminated fluid is flowed into a first filter element that provides a first filtration stage, yielding a flow of first stage permeate and a flow of first stage retentate. The first stage retentate becomes a feed stream to a second filtration stage, producing a flow of second stage permeate and a flow of second stage retentate. Optionally, the second stage retentate may be treated as a feed stream for a third filtration stage, yielding a flow of third stage permeate and third stage retentate. Any one or more of the staged feed steams may be treated with electromagnetic pulses as described herein.

The invention may also be employed in a cross-flow filtration system configured to provide multiple passes of permeate through filter elements. In such systems, an initial feed stream of contaminated fluid is flowed into a first filter element that provides a first filtration pass, yielding a flow of first pass permeate and a flow of first pass retentate. The first pass permeate of a first filtration element is flowed as a second feed stream to a second filter element to further purify the first permeate, and to yield a second pass permeate. Optionally, the second pass permeate may be flowed as a third feed stream to a third filter element. Any one or more of the feed steams may be treated with electromagnetic pulses as described herein.

While filtration systems having three stages or passes are described herein, the present invention is not limited in this regard as any number of stages or passes can be employed without departing from the broader aspects of the present invention.

Some cross-flow filtration systems may employ both multi-stage and multi-pass configurations.

While some of the following description refers specifically to a reverse osmosis system, the invention is not limited in this regard. Electromagnetic pulse treatment can be provided in reverse osmosis systems designed to reclaim water for drinking purposes, for use in power plants, etc. It should be understood, however, that the invention can be practiced as well with any other type of cross-flow filtration system.

An illustrative reverse osmosis element for a cross-flow filtration system provides 50% recovery, in other words, the volume rate yield (e.g., liters per minute) of permeate is about 50% of the volume rate of the feed stream. Accordingly, in a three-stage reverse osmosis system that does not employ electromagnetic pulse treatment as described herein, and that provides an initial feed stream of 100 gallons per minute (gal/min)(about 6.3 liters per second (1/s)), the first stage yields about 50 gal/min (about 3.15 l/s) product and about 50 gal/min retentate. The second stage, which receives the about 50 gal/min retentate as a feed stream, yields about 25 gal/min (about 1.57 l/s) product and about 25 gal/min retentate. The third stage, which receives the about 25 gal/min second stage retentate as a feed stream, yields about 12.5 gal/min (about 0.8 l/s) product and about 12.5 gal/min retentate. The maximum expected recovery (i.e., the expected maximum accumulated permeate) is therefore about 87.5% of the initial feed stream; actual yields of about 83% are attained.

In multi-stage reverse osmosis systems that do not employ electromagnetic pulse treatment as described herein, fouling and scaling occurs in the reverse osmosis elements. In some cases, fouling is predominant the first stage, while scaling is more prevalent in later stages. Fouling and scaling reduce the yield rate of the filter elements and of the system in which the elements are employed. Electromagnetic pulse treatment as described herein may be provided at various points in a multi-stage reverse osmosis system, to forestall fouling and scaling and the associated reduction in yield rate. The effect of the electromagnetic pulse treatment may differ at different stages. For example, providing electromagnetic pulse treatment in advance of the first stage of a multi-stage reverse osmosis system is expected principally to reduce fouling at the first stage, whereas providing electromagnetic pulse treatment after the first stage, for example, between the second and third stages, is expected principally to reduce scaling at a second or third stage. It is believed that the reduction in scaling will be attained because the electromagnetic pulse treatment can initiate precipitation of dissolved solutes in the feed stream, even in the absence of solids in the feed stream or on the interior surface (i.e., the feed stream surface) of the reverse osmosis membrane. In addition to reducing fouling and scaling, the electromagnetic pulse treatment described herein can in some cases increase the yield of a reverse osmosis element.

The invention provides an apparatus and a method for the treatment of aqueous solutions undergoing cross-flow filtration. Said treatment includes one or more of increasing the size and/or consistency of particulate matter contained in the solution, impeding the growth of microorganisms such as bacteria, and reducing the tendency for mineral scale such as $CaCO_3$ and $CaSO_4$ to form on the filtration membrane. Said treatment is the result of the presence of electromagnetic fields in the fluid to be treated. Said fields possess one or more of the following characteristics: a low frequency component (commonly 50 to 60 Hz); a high frequency component (commonly 10 to 100 kHz); fields vary in strength and direction with time and position within the treatment device; the high frequency component of the signal is similar in form to a signal produced by a damped LC (inductor capacitor) circuit in which the current is rapidly and repeatedly interrupted. Signals of this type are sometimes called "ringing". The apparatus which generates the treating electromagnetic fields generally includes two components, a signal-generating component and a field-generating component. The signal-generating component includes electric power regulating devices such as transformers and switching devices which range upward in complexity and sophistication from simple diodes. Field-generation devices include but are not limited to induction coils and/or metal foils which act as the plates of a parallel plate capacitor. The apparatus also includes a means to introduce the fields generated into the water to be treated. This is accomplished by placing the field generation devices in close proximity to the water to be treated.

The electric and/or magnetic fields may be used as a part of, or a pretreatment for, cross-flow membrane filtration processes to improve the filterability of the fluid through a reduction of: fluid turbidity, biological activity within the fluid, and the tendency of the fluid to form a scale on the membrane. As a secondary effect of the conditions resulting from the treatment process, the corrosivity of the treated fluid to materials of construction may be reduced. The fluids treated by the invention will normally be contained in, and flowing through, a channel such as a pipe. Alternatively, the fluids can be contained within a vessel which may be closed or open to the environment and in which the fluid is essentially stagnant, such as a membrane bioreactor.

As disclosed in U.S. Pat. Nos. 5,702,600 and 6,063,267 as well as United States Patent Application Publication No. US-2007-0051685-A1 (application Ser. No. 11/304,348) for "Method and Apparatus for Treating Fluids" and United States Patent Application Publication No. US-2006-0124557-A1 (application Ser. No. 11/192,452) for "System and Method of Generating a Ringing Magnetic Pulse for the Treatment of Flowing Liquids," a series of devices have been developed to limit bacterial growth and the formation of scale in a variety of fluid systems. All of the foregoing United States patent documents are incorporated herein by reference. Although not discussed in these disclosures, the mechanism by which these devices limit the formation of scale is also believed to cause particulate matter to grow in size and, thereby, become more filterable. Collectively, devices described in the aforementioned patents and applications will be referred to as "pulsed power devices". One such device is currently manufactured by Clearwater Systems Corporation of Essex Conn. and is marketed under the trade name "DOLPHIN™ device." To date, the primary purpose of the DOLPHIN™ device and preceding devices has been the treatment of water in air conditioning cooling towers.

Without wishing to be bound by any particular theory, water treatment by the DOLPHIN™ device and preceding devices (pulsed power devices) appears to be the result of the presence of magnetic and electric fields which vary with time in strength and direction. These fields exist within a pipe containing flowing water and result in modifications to the properties of the treated water which are considered to be beneficial. Aspects of the apparatus and methods of operation of the DOLPHIN™ device that are pertinent to the present disclosure are described briefly below in the context of operation in a cooling tower environment.

To date pulsed power devices have consisted of two primary components: the control panel and the coil pipe assembly. The control panel consists of components necessary to generate a relatively low voltage (in the range of 11 to 37 volts) 50-60 cycle signal and to rapidly and repeatedly interrupt that signal, i.e., to switch the signal on and off. The coil pipe assembly consists of a section of pipe, the material and dimensions of which may vary. One or more induction coils are placed circumferentially around the pipe. These coil(s) may or may not be coupled with one or more capacitors. The coils and any associated capacitance are sized so that when the 50-60 cycle signal is interrupted by the components located in the control panel a high voltage (up to 300 volts) high frequency (10 to 50 kHz) rapidly decaying signal is generated. This signal and its decay rate are the natural responses to the inductive and capacitive characteristics of the coil(s). Signal generation in this manner is commonly known as "ringing" the coil.

As described by Ampere's law (Eq. 1):

$$\oint B \cdot dl = \mu_0 i \quad (1)$$

where: B is the magnetic field strength
dl is a differential length
$\mu_0$ is the permeability constant
i is the current The passage of current through a wire creates a magnetic field in a circumferential direction around the wire through which the current passes. In the case of the DOLPHIN™ device where the current is being carried in a coil, the resulting magnetic field is directed axially along the pipe in either the plus or minus direction (depending on the direction of the current). Given that the current in the wire varies with time, so does the resulting magnetic field.

As described by Faraday's law (Eq. 2)

$$\oint E \cdot dl = -\frac{d\Phi_B}{dt} \quad (2)$$

where: E is the electric field
dl is a differential length
$d\Phi_B/dt$ is the rate of change of the magnetic flux A time varying magnetic field, as is created by both the 50-60 Hz and the ringing currents in the DOLPHIN™ device's coil, creates an electric field that is oriented at right angles to the magnetic field. Ignoring end effects, the electric field in an induction coil is circumferential.

Two of the principal actions of the DOLPHIN™ device, the precipitation of calcium carbonate as powder rather than scale, and the control of biological activity, are directly ascribed to the existence of the above described electrical and magnetic fields. Powder precipitation has been ascribed to a reduction or elimination of the surface charge that is normally present on colloidal particles by the time varying electric and magnetic fields. The reduction in surface charges substantially reduces or eliminates the electrostatic repulsion between these particles, which, in turn, increases collisions between particles resulting in rapid particle growth and settling (as opposed to scaling on heat transfer surfaces). The control of biological activity has been ascribed to encapsulation of bacteria in the precipitating calcium powder, as previously described, and to a direct interaction between the cell membrane and the electric and magnetic fields. Bacterial cell membranes are known to act as electrical capacitors. When stimulated by electric and/or magnetic fields at the proper frequency, significant disruptions in the functions of the membranes are known to occur. When power levels are sufficiently high, as described in U.S. Pat. No. 6,863,805, which addresses the subject of cold pasteurization, the cell membranes are known to rupture by a process called electroporation.

Figure 6:
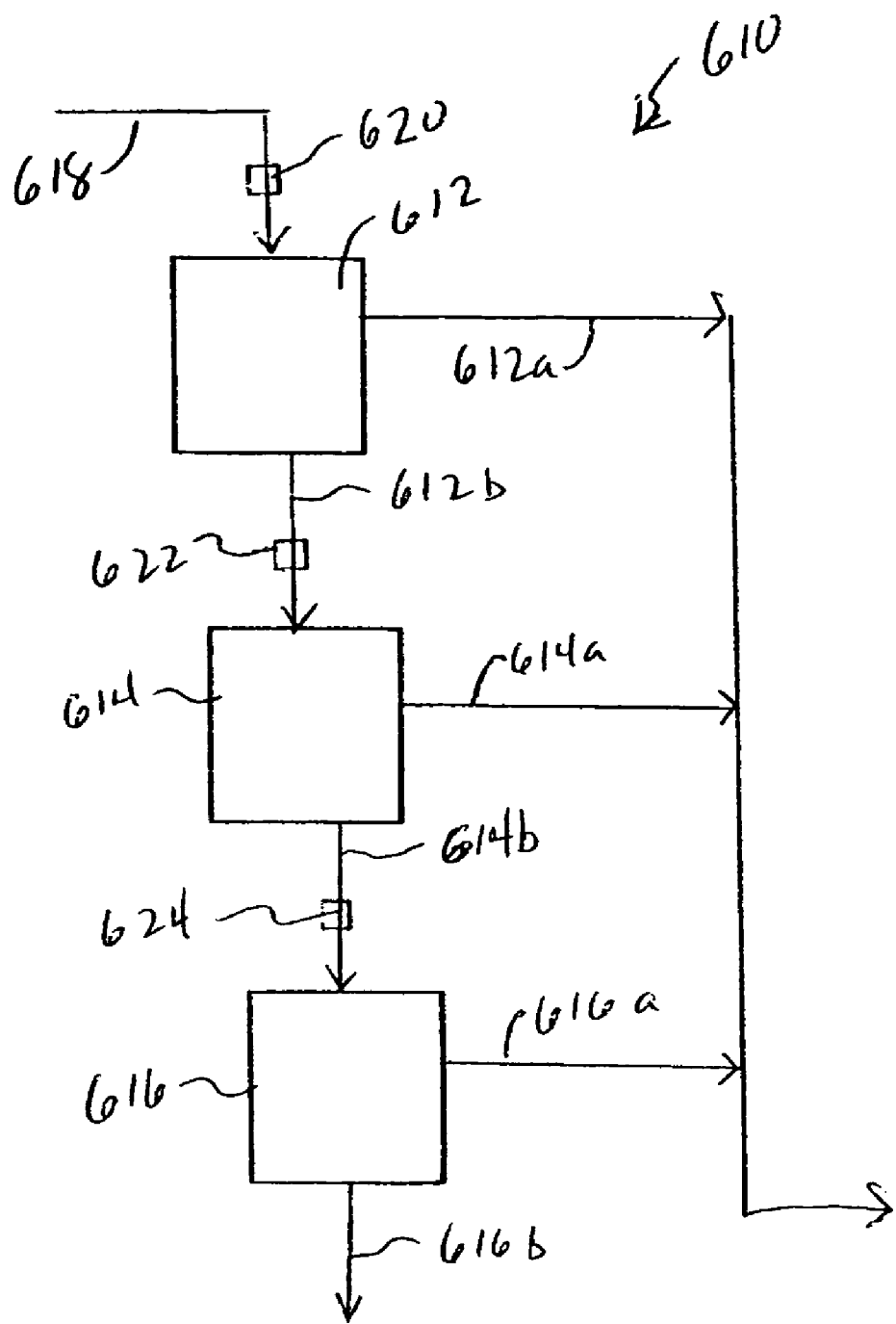
FIG. 6 is a schematic view of a reverse osmosis element portion of a reverse osmosis system that employs electromagnetic pulse treatment as described herein, according to one embodiment of the present invention.

A schematic representation of a multi-stage reverse osmosis system that employs electromagnetic pulse treatment as described herein is seen in FIG. 6. Reverse osmosis system 610 comprises a first reverse osmosis element 612, a second reverse osmosis element 614 and a third reverse osmosis element 616, all disposed in successive, staged relationship to each other. A conduit 618 is connected to the input of reverse osmosis element 612 to provide an initial aqueous feed stream to reverse osmosis element 612. The conduit 618 is equipped with a first electromagnetic pulse coil 620 upstream from first reverse osmosis element 612. The reverse osmosis element 612 yields two outputs via conduits 612a and 612b. Conduit 612a carries a flow of permeate from reverse osmosis element 612 and is connected to a product collection line 621. Conduit 612b carries a flow of retentate from reverse osmosis element 612 and is connected to the input to reverse osmosis element 614, so that the retentate from reverse osmosis element 612 is provided as a feed stream to reverse osmosis element 614. A second electromagnetic pulse coil 622 is mounted to conduit 612b, upstream from reverse osmosis element 614.

Reverse osmosis element 614 yields two outputs at conduit 614a and conduit 614b. Conduit 614a carries a flow of permeate from reverse osmosis element 614 and is connected to the product collection line 621. Conduit 614b carries a flow of retentate from reverse osmosis element 614 and is connected to the input to reverse osmosis element 616, so that the retentate from reverse osmosis element 614 is provided as a feed stream to reverse osmosis element 616. A third electromagnetic pulse coil 624 is mounted on the conduit 614b, upstream from the third reverse osmosis element 616.

The third reverse osmosis element 616 yields two outputs at conduit 616a and conduit 616b. Conduit 616a carries a flow permeate from reverse osmosis element 616 and is connected to the product collection line 621. Conduit 616b is a waste collection conduit to which retentate from reverse osmosis element 616 flows.

In various embodiments, system 610 may include any single one of electromagnetic pulse coils 620, 622 or 624; or a combination of any two of the electromagnetic pulse coils or, optionally, all three electromagnetic pulse coils. As described further below, an electromagnetic pulse coil may comprise a coil of wire wrapped around the conduit.

In operation, each feed stream is provided to the respective reverse osmosis element under pressure sufficient to yield a flow of permeate and a flow of retentate from the element. Before the conduit 618 provides the initial feed stream to the first reverse osmosis element 612, the feed stream is pre-treated to remove particulates in a pre-treatment system (not shown). The pre-treated feed stream is then flowed via the conduit 618 to the first reverse osmosis element 612. The reverse osmosis element 612 separates purified water (the permeate), which is released via conduit 612a, from water with concentrated contaminants (the retentate, which may contain particulates, dissolved ions and/or biological contaminants), which is released via conduit 612b. The retentate in conduit 612b is provided as a feed stream to reverse osmosis element 614.

Reverse osmosis element 614 separates purified water (the permeate), which is released via conduit 614a, from water with concentrated salts (the retentate), which is released via conduit 614b. The retentate in conduit 614b is provided as a feed stream to reverse osmosis element 616.

Reverse osmosis element 616 separates purified water (the permeate), which is released via conduit 616a, from water with concentrated salts (the retentate), which is released via conduit 616b.

While feed streams are flowing into reverse osmosis element 612, 614 and/or 616, at least one electromagnetic pulse coil 620, 622 and/or 624 is powered to generate high frequency electromagnetic pulses.

An apparatus that can employ coils such as electromagnetic pulse coil 620, 622 and/or 624 to generate electromagnetic pulses suitable to achieve the present invention is disclosed and described below, with reference to FIGS. 1-5.

An apparatus for generating a ringing magnetic pulse for treating feed streams of flowing contaminated liquids in accordance with the present invention is indicated generally in FIG. 1 by the reference number 10. The apparatus 10 comprises an input power transformer 12 having first and second output terminals 14, 16, a coil assembly 18, an SCR 20, a optical relay 22, a MOSFET 24 serving as an electronically controlled switch, a current level switch 26, a peak voltage detector 28, and a programmable digital microcontroller 30.

It has been discovered that digital control systems for generating a ringing magnetic pulse can be modified in order to be of simpler construction and less expensive by substituting a single silicon controlled rectifier (SCR) switch for a MOSFET switch assembly. This substitution provides significant benefits in the generation of the ringing pulse as well as the low frequency electromagnetic field, both of which are considered important in the treatment of fluids. SCRs are available with higher current ratings and lower losses relative to MOSFETs, and a single device can easily handle the coil current. As a result of using the SCR where prior art devices employed a MOSFET, the ringing pulse and the low frequency electromagnetic field are generated more efficiently than in previous devices. However, SCRs cannot be electronically turned off as a MOSFET can, so that the high voltage "ringing" pulse has to be produced some other way than by interrupting the coil current pulse, as will be explained more fully below.

Referring again to FIG. 1, the coil assembly 18 (which is provided as any one or more of electromagnetic pulse coil 620, 622 and/or 624), which comprises a coil and is characterized as having an inductance and a capacitance connected in parallel, has a first end coupled to the first terminal 14 of the transformer 12. The illustrated capacitance can be and is herein taken to be comprised solely of the capacitance of the coil, but in some coils the stray capacitance may be supplemented by a discrete capacitor connected in parallel with the coil. The SCR 20 has a cathode coupled to a second end 31 of the coil assembly 18, and an anode coupled to the second output terminal 16 of the transformer 12. As shown, the anode of the SCR 20 is coupled to electrical ground. The optical relay 22 serves as an SCR gate switch. As shown in FIG. 1, the optical relay 22 is a switch that has a first terminal 32 coupled to the gate of the SCR 20 via a gate resistor 34, and a second terminal 36 coupled to ground potential. The optical relay 22 includes a light emitting diode (LED) 38 that when energized to emit light closes the switch to enable current flow between the first and second terminals 32, 36 of the optical relay 22. Thus, the coil assembly 18 and the SCR 20 form a series connected circuit in parallel to the power transformer 12, making a first loop. The switch of the optical relay 22 may be an optical triac or an optical MOSFET.

The microcontroller 30 includes a first output 40 coupled to an anode of the LED 38 via a resistor 42, a second output 44 coupled to the current level switch 26, and a third output 46 coupled to the peak voltage detector 28. The current level switch 26 includes a first output 48 coupled to the microcontroller 30, and a second output 50 coupled to the gate of the MOSFET 24. The peak voltage detector 28 includes an output 52 coupled to the microcontroller 30. A digitally controlled current reference potentiometer 54 is coupled to an input of the current level switch 26, and is adjustable by the microcontroller 30. A digitally controlled voltage reference potentiometer 56 is coupled to the peak voltage detector 28, and is adjustable by the microcontroller 30.

The MOSFET 24, such as the illustrated n-channel IGFET with substrate tied to source, includes a source coupled to ground potential, and a drain coupled to the second end 31 of the coil assembly 18 via a current sense resistor 58. A high voltage Schottky diode 60 has an anode coupled to the second end 31 of the coil assembly 18 and a cathode coupled to an input 62 of the peak voltage detector 28.

The apparatus 10 is generally preferably mounted on a printed circuit board (not shown). However, two components are preferably external to the printed circuit board (PCB), namely, the coil assembly 18 and the power transformer 12. The transformer 12 provides a 50-60 Hz AC power to power the coil assembly 18. The main power component on the PCB is the SCR 20 which is preferably heat-sinked and which functions as a controllable diode. When an ordinary diode is forward-biased (anode voltage positive with respect to the cathode) it conducts current. When an SCR is forward-biased it will not conduct current unless the gate (control) lead is also forward-biased. Both an SCR and an ordinary diode will block current if they are reverse-biased.

When the SCR gate lead is connected to its anode (via a resistor), the SCR will conduct current when the SCR anode is positive with respect to its cathode. This occurs during the negative voltage half-cycle (as referenced to the SCR anode which is considered to be circuit ground in FIG. 1). Since the coil assembly 18 is predominantly inductive (with some small internal resistance) at 60 Hz, negative current will continue to flow for a large portion of the positive voltage half-cycle. When the current drops to zero, the SCR 20 will block positive current flow (from cathode to anode) as does a diode rectifier. When the SCR 20 turns off, the voltage across the SCR will jump to a positive level during the remainder of the positive voltage half-cycle. It is during this positive voltage period that the microcontroller 30 generates at least one ringing current and voltage pulse within the coil assembly 18.

A ringing pulse across the coil assembly 18 is created by first closing the MOSFET solid-state switch 24 for a brief period at any time during the positive voltage cycle when the SCR 20 is off. The MOSFET 24 is closed, or made to conduct, by applying a positive voltage to its control electrode or gate via the current level switch 26. Positive current will build up in the coil assembly 18 while the MOSFET 24 is closed (the rise time is determined by the value of the current sense resistor 58 and the inductance of the coil assembly 18). When the current level reaches a designated trigger value, the MOSFET switch 24 is abruptly opened by the current level switch 26 (the current level switch removes the positive voltage from the gate of the MOSFET 24, which causes the MOSFET to become non-conducting). The inductance and capacitance values of the coil assembly 18 will determine the frequency of the resulting resonating current flow within the coil and the magnitude of the ringing voltage as viewed across the SCR 20. The decay time of the ring is determined by the internal resistance of the coil assembly 18.

The gate resistor 34 of the SCR 20 must be disconnected from the anode of the SCR during the positive voltage period to prevent the SCR from turning on when ringing pulses are generated—which would quickly terminate the ring. An optical relay 22 (as shown in FIG. 1) is provided for this purpose. The optical relay 22 need only be energized prior to the start of the negative voltage half-cycle. Once current starts to flow in the SCR 20, the optical relay 22 can be de-energized. The SCR 20 will continue to conduct until current drops to zero and the cathode-to-anode voltage across the SCR is positive. Interestingly, a small ringing pulse in the coil assembly 18 occurs when the SCR 20 switches off which is caused by the charge stored in the coil capacitance.

The operation of the apparatus 10 is primarily implemented using the programmable digital microcontroller 30 coupled to and aided by the peak voltage detector 28 and the current level switch 26. The microcontroller 30 does not directly interface with the coil assembly 18, the SCR 20 and the MOSFET 24; nor does the microcontroller directly view the coil voltage level. The coil voltage is presented to the current level switch 26 and the peak voltage detector 28 through the high voltage Schottky diode 60. The current level switch 26 and the peak voltage detector 28 compare the incoming voltage level to a reference voltage level set by the digitally controlled potentiometers 54, 56, respectively to determine its action.

The primary function of the peak voltage detector 28 is to compare the level of the coil ringing voltage signal to the reference level set by the digital potentiometer 56 associated with the peak voltage detector. If the peak level exceeds the given reference level, the peak voltage detector 28 will store that event so that it can be later read by the microcontroller 30. The stored event is cleared after it is read by the microcontroller 30. The peak voltage detector 28 is used to determine that the peak voltage exceeds the minimum desired value and also that it does not exceed a maximum value. A secondary function of the peak voltage detector 28 is to determine the value of the transformer voltage on start-up. The microcontroller 30 needs to know the transformer voltage because the ring signal rides on top of the transformer voltage. The transformer voltage reading is added to the desired ring voltage level when the reference voltage is set.

The current level switch 26 controls the MOSFET 24 used to generate the coil ringing pulse. The microcontroller 30 sends a trigger pulse to the current level switch 26 to initiate a ring. When triggered, the current level switch 26 raises the voltage on the gate lead of the MOSFET 24, thereby turning it on. The "on" resistance of the MOSFET 24 is much less than the value of the current sense resistor 58. The MOSFET 24 is held "on" until the voltage at the current sense resistor 58—coil junction (the cathode of the SCR 20) exceeds the reference voltage set by the current reference potentiometer 54 associated with the current level switch 26. The value of the resistor 58 and the reference voltage is not as important as ensuring that the current value at which the MOSFET 24 turns off is repeatable for a given potentiometer setting. The role of the microcontroller 30 is to adjust the potentiometer 54 of the current level switch 26 to achieve the desired voltage level for the coil "ring." Thus, the microcontroller 30, potentiometer 54 and current level switch 26 regulate at least the initial voltage of the ringing current pulse. Optionally, the microcontroller 30, potentiometer 54 and current level switch 26 are adapted to keep the voltage of the ringing current plus between a predetermined minimum value and a predetermined maximum value.

The overall operation of the microcontroller 30 is executed in software embedded within the microcontroller. The functions of that software program are now described. When the apparatus 10 is first powered-up, the SCR 20 and the MOSFET 24 are both off (i.e. no current flows through the coil assembly 18). The first task of the microcontroller 30 is to test for the presence of coil power voltage from the transformer 12. This can be accomplished by setting the peak voltage detector 28 at a low level and monitoring the output. An alternative method is to monitor a tap provided in the current level switch 26 which reads zero when the coil voltage is negative and rises to +0.5V when the coil voltage goes positive. The microcontroller 30 waits until it observes two alternating 50-60 Hz power line voltage cycles before proceeding. When the AC coil voltage is detected, the microcontroller 30 will measure its peak level by monitoring the output of the peak voltage detector 28 while it raises the level of the voltage reference potentiometer 56. The peak level reading is retained in the microcontroller 30 and used as an offset for adjusting the level of the generated ring pulses which ride on the coil power voltage.

The next software task is to turn on the SCR 20, which is a periodic task occurring once per voltage cycle. Since the SCR anode is used as the ground-reference, the SCR anode-to-cathode voltage is negative during the positive voltage portion of the cycle. Just before the end of the positive voltage period, the SCR gate switch or optical relay 22 is turned on by powering its optically coupled LED 38. When the negative voltage across the SCR 20 is approximately 2 volts, the SCR will begin to conduct current, at which time power to the gate switch LED 38 is removed. The SCR 20 will remain latched on without the gate switch 22 being powered, until the SCR 20 current flow drops to zero.

The ringing pulses are produced by a second periodic software task. This task waits until the SCR 20 turns off and a positive coil voltage is detected (which is a sharp jump nearly the height of the peak coil voltage). The task waits a few milliseconds to allow the small coil ring (which occurs when the SCR 20 turns off) to die out. To generate a high voltage ringing pulse the software sends a trigger signal to the current level switch 26, which turns on the MOSFET 24, allowing positive current flow to rise in the coil assembly 18. The task monitors the current level switch 26. When the current level switch signals that the desired amount of current is present in the circuit, the MOSFET is turned off. The rapid cessation of the flow of current in the coil triggers a large coil ring.

The microcontroller generates a sequence of large ringing pulses in the second half-cycle of the AC power source. The timing of each ringing pulse in a sequence may be timed in relation to the preceding pulse. For example, the microcontroller may delay the generation of a subsequent ringing pulse for an idle period until the preceding ringing pulse substantially decays. For one example of such substantial decay, the generation of a subsequent ringing pulse may be delayed at least until the magnitude of a preceding pulse decays to about 5% of the initial magnitude. Following this idle period, the periodic software task is repeated and a second or subsequent large ringing pulse is generated. The number of pulses which may be generated during each positive voltage period depends on the inductance, capacitance, resistance, and voltage in the circuit; 4-6 rings are typical.

In an alternative embodiment, the microcontroller is programmed so that the wait time from when the MOSFET 24 is turned off to when the MOSFET 24 is turned on again in preparation for generating the next ring is shorter than in the preceding embodiment of the invention. As a result of this shorter wait period, the generation of significantly greater number of rings is possible during each positive voltage period, however, each ring is not permitted to substantially decay as it was in the first embodiment. For example, a subsequent ringing pulse may be generated before the preceding ringing pulse decays to about 5%, or to about 10%, of its initial magnitude. Optionally, a subsequent ringing pulse may be generated before the previous ringing pulse decays to about 25%, optionally before the previous ringing pulse decays to about 50% of its initial magnitude. In some embodiments, a subsequent ringing pulse may be generated when the magnitude of the preceding pulse decays to about 10 to about 50% of the initial magnitude. Optionally, a subsequent pulse may be generated when the magnitude of the preceding pulse decays by about 15 to about 25% of the initial magnitude.

During the negative voltage period, the microcontroller 30 determines if the peak voltage detector 28 has been triggered, which indicates that ringing signal exceeded the reference level set in the voltage reference potentiometer 56. The voltage reference potentiometer 56 can be set to either the minimum or the maximum desired peak voltage level. If the voltage reference potentiometer 56 is set for the minimum peak voltage, and the peak voltage detector 28 has not been triggered, the microcontroller 30 will increase the level of the current reference potentiometer 54 and leave the voltage reference potentiometer 56 at the minimum level. If the voltage reference potentiometer 56 is set for the minimum peak voltage, and the peak voltage detector 28 has been triggered, the microcontroller 30 will hold the level of the current reference potentiometer 54 and change the voltage reference potentiometer 56 to the maximum level. If the voltage reference potentiometer 56 is set to the maximum level, and the peak voltage detector 28 has been triggered, the microcontroller 30 will decrease the level of the current reference potentiometer 54 and leave the voltage reference potentiometer 56 at the maximum level. If the voltage reference potentiometer 56 is set to the maximum level, and the peak voltage detector 28 has not been triggered, the microcontroller 30 will hold the level of the current reference potentiometer 54 and change the voltage reference potentiometer 56 to the minimum level. The preceding actions will move and bold the peak voltage level for the ring pulse between the minimum and maximum desired values. The above logic pattern serves as a digital voltage regulator for the ringing voltage pulse.

Also during the negative voltage period, the microcontroller 30 reads the resistance value of a negative temperature coefficient (NTC) thermistor (not shown) affixed to the heat sink of the SCR 20. If the resistance drops below the value equated to the maximum temperature designated for the SCR heat sink (which is lower than destruction level for the SCR 20) the microcontroller 30 will turn off the SCR and also cease generating ringing pulses. The microcontroller 30 will continue to periodically read the thermistor and when it is determined that the SCR temperature has dropped to a safe level, the microcontroller will automatically resume operation.

On the bottom of the printed circuit board can be two status LEDs (not shown), preferably one red and one green, that are viewable through holes in a controller cover. The green LED is lit when the microcontroller 30 has determined that the voltage level of the ringing pulses is within the desired range, otherwise the red LED is lit. A single-pole double-throw relay contact (not shown) is preferably provided for remotely monitoring the status—when the green LED is lit the relay is energized.

The functioning of the above-described SCR-switched circuit is as follows: The SCR (Silicon Controlled Rectifier) acts like a diode with a controllable turn-on capability. When voltage is applied in the "forward direction" (forward-biased-anode positive with respect to cathode) a diode will conduct current. However, the SCR will NOT conduct when forward-biased unless a current is made to flow in its "gate" circuit. If no gate current is applied, the SCR will "block" the flow of current even when forward-biased. Both the SCR and the diode will block the flow of current when the direction of current flow reverses (cathode to anode is the reverse-current direction). The SCR cannot be turned off by removing its gate current after it has been turned on. It can only be turned off by reversing the direction of current flow. In this it acts the same as a silicon diode (rectifier). Hence its name, "silicon controlled rectifier".

With this as background, a normal cycle of the system proceeds as follows. The coil, transformer and SCR switch are all connected in series. When the time-varying (50 or 60 cycles per second) transformer voltage applies a forward bias to the SCR, gate current is applied and the SCR conducts current through the coil. The SCR has a very low voltage drop from anode to cathode when conducting (less than or equal to one volt typically) so it acts like an almost-perfect switch. On the circuit boards of prior devices MOSFETs (Metal-Oxide-Silicon Field Effect Transistors) are used as the switch, and these MOSFETs have a larger "forward" voltage drop than does an SCR and so dissipate more heat than the SCR. For this reason, in the prior devices ten parallel-connected MOSFETs are used to carry the coil current, where a single SCR will do the same job in devices according to the present invention with lower overall power loss.

When the coil current attempts to reverse direction, the SCR turns off and allows voltage to rise across it, just as a diode would do. The SCR then blocks current flow when the current reverses. Because the voltage and current across the coil are almost 90 degrees out of phase with each other, the current crosses zero (reverses) when there is still substantial voltage across the coil. This frees the coil to "ring" at a low voltage level due to the energy stored in its stray capacitance.

After this initial small or natural "ringing" pulse has died out, a small current is allowed to build up in the coil by closing a MOSFET switch. This switch does not carry the main coil current, so a small switch can be used for this "recharging" function.

When this current has reached a preset level, the MOSFET is turned off, and the coil voltage "rings" again, this time producing a large ringing pulse at a higher voltage level, depending on the amount of current that is allowed to build up.

The regulator circuit measures the peak value of this "ringing" voltage and compares it to the desired value, which is stored as a number in the microprocessor "chip" on the circuit board. If the voltage is too low, then after the ringing pulse has died away the microprocessor turns the MOSFET on again and holds it "on" for a longer time, allowing more coil current to build up than before. The MOSFET is then turned off, and the large ringing pulse repeats.

If the pulse voltage is too high, the microprocessor reduces the "on time" of the MOSFET switch for the next pulse, causing less coil current to build up. The MOSFET then turns off and the ringing voltage is again measured.

When the ringing voltage has reached the desired level (it falls within a "window" range of voltages stored in the microprocessor), the regulator "remembers" this and fixes the MOSFET "on" time for subsequent pulses at this value unless the pulse voltage drifts outside the "window" again. This can occur if the coil resistance changes as the coil temperature changes during operation. If that occurs, preceding steps are repeated until the voltage is once again within the "window".

All the large "ringing" pulses are generated during the interval when the SCR switch is reverse-biased by the applied circuit voltage from the power transformer. The SCR allows the ringing pulses to occur (its gate current is zero during this interval), even though the ringing pulse voltage will at times cause the SCR voltage to switch over to the "forward" bias condition. The SCR will not turn on when this occurs, unlike a diode, as its gate current is held to zero by the gate driver switch.

Several large ringing pulses can be inserted in the reverse bias time interval. The number of pulses depends on the desired voltage of the pulse, the inductance of the coil, the capacitance in parallel with the coil (including stray capacitance) and the degree to which each pulse is permitted to decay. In a first embodiment of the invention, each pulse is allowed to substantially (optionally, fully) decay and, all other parameters being equal, fewer pulses are produced. In a second embodiment of the invention, the pulses are not permitted to substantially decay prior to the generation of the next pulse; this allows the generation of a significantly greater number of pulses. The difference between these embodiments may be seen by comparing FIGS. 4 and 5.

Other techniques can be used to generate ringing pulses similar to those described above. The preferred technique, as described above, uses the coil's inductance as an energy storage element to generate the ringing voltage, so it is a simpler method than others which must store the energy elsewhere. However, any device that stores the required pulse energy can be used to generate a ringing pulse. For example, a capacitor can be charged to 150 volts (or any other desired voltage) and switched across the coil during the "off time" of the coil current. This too will generate a ringing pulse, but it requires a high voltage power supply and an extra capacitor. This method also increases the capacitance in the "ringing" circuit, and causes a lower "ringing" frequency than our method does. The preferred method uses the unavoidable "stray" capacitance of the coil as the resonating capacitance, and generates the highest possible ringing frequency.

Figure 2:
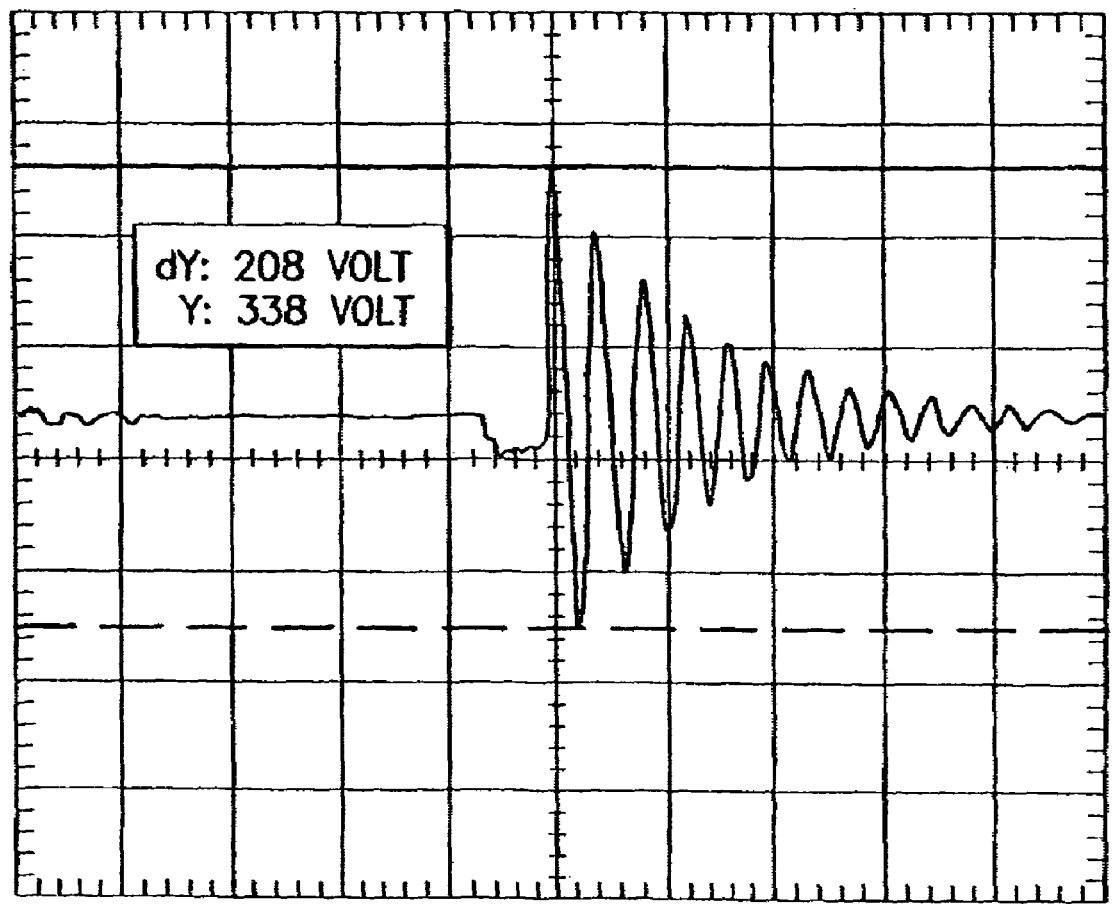
FIG. 2 is an oscilloscope trace showing a single large ringing pulse according to the invention.
Figure 3:
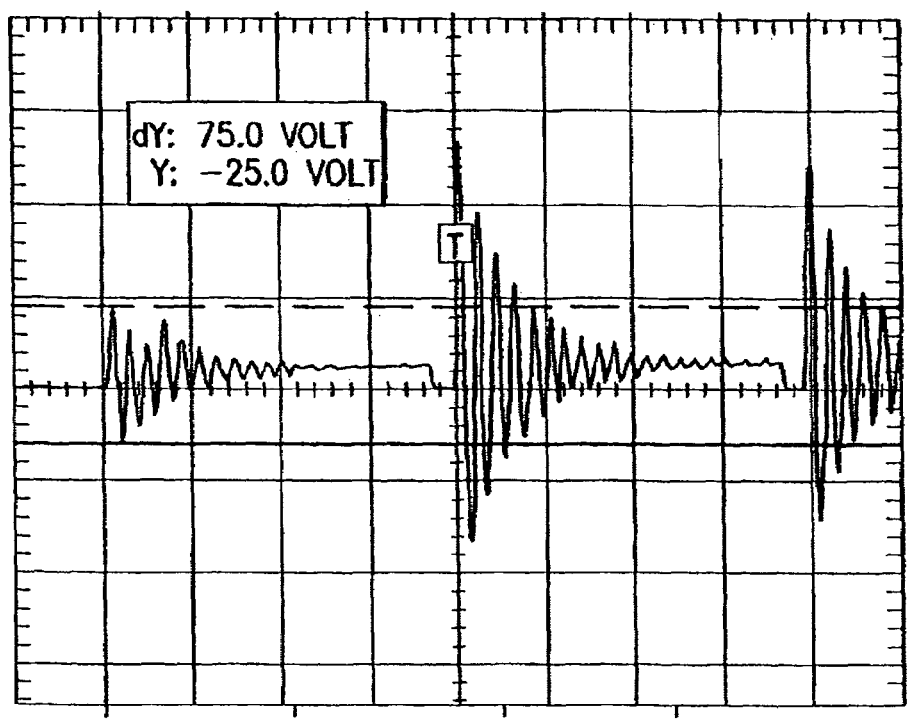
FIG. 3 is an oscilloscope trace showing a "natural" ringing pulse followed by more than one large ringing pulse according to the invention.
Figure 4:
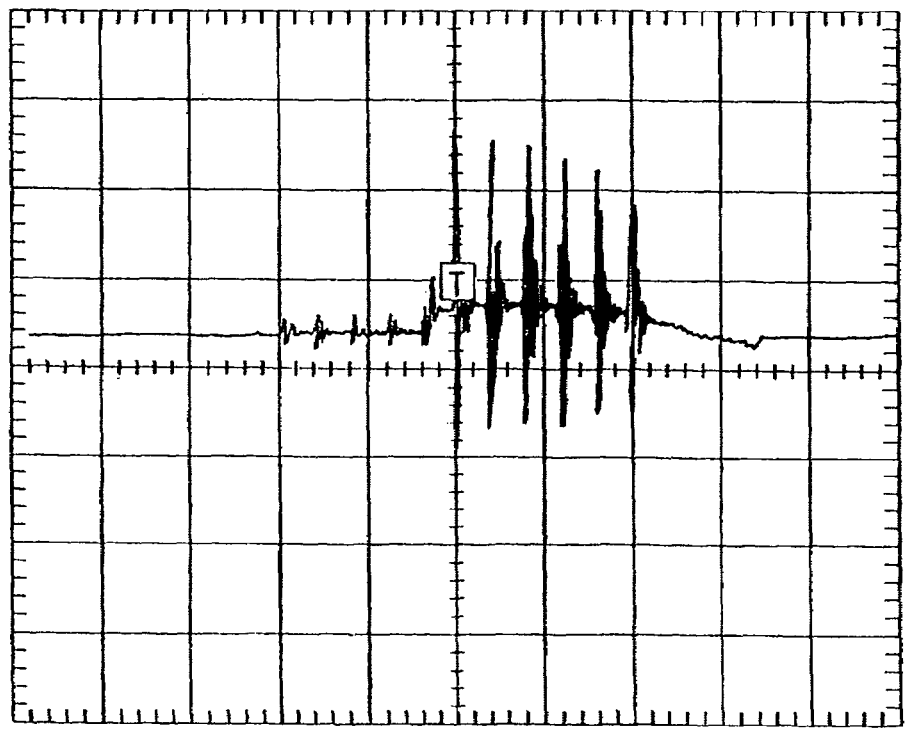
FIG. 4 is an oscilloscope trace showing a series of six full large ringing pulses according to the invention.

A session testing the performance of a device such as shown by FIG. 1 and as described above with a digital scope on a workbench produced the results shown in FIGS. 2, 3 and 4. As can be seen, the inventive control circuit can fit several (in this case six) large ringing pulses into the available "off" time window between transformer current pulses. The number of large ringing pulses is selectable by inputting a number to the control program via the computer programming interface.

FIG. 2 shows a single pulse from the group; the printing at the left indicates the two horizontal cursor lines were 208 volts apart. The sweep speed is 100 microseconds (μs)/division. The voltage scale is 50V/division.

In FIG. 3 is seen the first "natural" ring when the SCR turns off, about 75 volts peak-to-peak. Then come the large rings caused by the control circuit. The large ringing pulses are between three and four times larger in voltage than the small "natural" ringing pulse. More than one large ringing pulse visible in FIG. 3. The sweep speed for this FIG. 3 is 200 μs/division and the voltage scale is 50V/division.

In FIG. 4 we see a full six large ringing pulses, each of the pulses after the first beginning after the prior pulse has substantially decayed. These fit into the approximately 8 millisecond "SCR off" time for this size (one inch) device. With larger coils, this time may be shorter and fewer pulses will fit in. The sweep speed here is 2 ms/division and the voltage scale is 50V/division.

Figure 5:
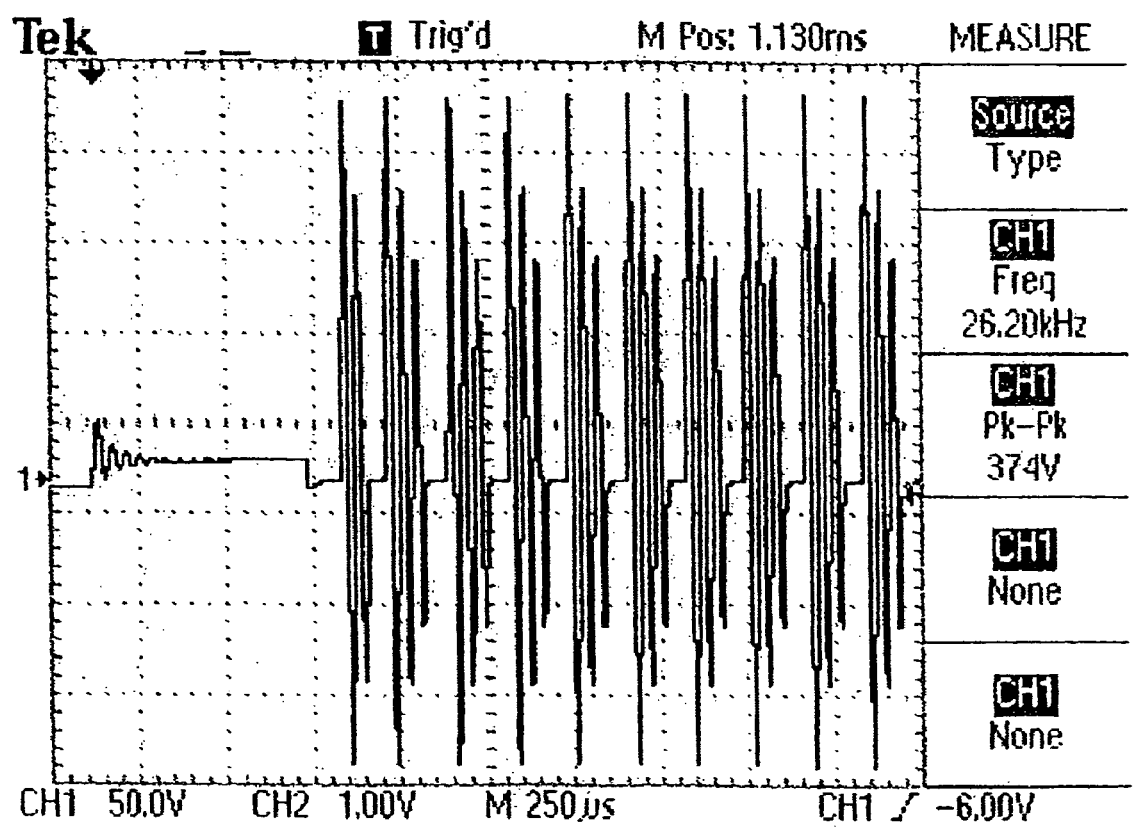
FIG. 5 is an oscilloscope trace showing a series of ringing pulses initiated without letting prior pulses substantially decay, according to one embodiment of the invention.

Finally, FIG. 5 shows the result of more than six ringing pulses in an embodiment in which new ringing pulses are initiated before prior pulses substantially decay.

As is evident from the foregoing description, one or more large ringing pulses is generated within a time interval defined as a portion of a single cycle of a 50 or 60 hz AC signal. Thus, each such time interval has a duration corresponding to a portion of a cycle of a 50 or 60 hz signal. Optionally, the one or more large ringing pulses are generated in intervals defined as portions of successive cycles of the 50 or 60 hz AC signal, in which case the one or more large ringing pulses are said to occur in successive intervals spaced in a way that corresponds to 50 or 60 hz.

The circuit of the switching means illustrated in FIG. 1 is one which is operable to produce one period of ringing current and ringing voltage for each alternate half cycle of the applied supply voltage. However, if desired, the switching circuit can also be designed to operate in a full wave mode wherein a period of ringing current and of ringing voltage is produced for each half cycle of the supply voltage.

In summary, the apparatus and method embodying the present invention employs an SCR for handling the main coil current which is responsible for the formation of the low frequency electromagnetic field, and uses a single MOSFET switch to draw a relatively small current through the current coil(s) after the main current pulse has ended. One or more large ringing pulse or pulses is then produced by turning this switch off. Several ringing pulses can be produced in this way during the zero current interval through the coils. The number of pulses which may be generated depends on the characteristics of the system and whether each ring is allowed to substantially decay (first embodiment) or whether subsequent rings are generated prior to substantial decay in the previous ring (second embodiment).

One way to practice this invention is to situate a feed stream in proximity to the coil assembly while ringing pulses are being generated, for example, by flowing the feed stream through the magnetic flux generated by the coil assembly during the ringing pulses. In a particular embodiment, an apparatus embodying the invention may comprise a pipe unit that includes a pipe through which liquid to be treated passes. The pipe may be made of various materials, but as the treatment of the feed stream effected by the pipe unit involves the passage of electromagnetic flux through the walls of the pipe and into the liquid flowing therein, the pipe is preferably made of a non-electrical conducting material to avoid diminution of the amount of flux reaching the liquid. Other parts of the pipe unit may be contained in or mounted on a generally cylindrical housing surrounding the pipe.

The pipe unit includes one or more electrical coils of a coil assembly as described herein, surrounding the pipe, with an AC power source and control circuitry connected to the coil assembly as described herein. The number, design and arrangement of the coils making up the coil assembly may vary. In illustrative embodiments, the coil has four coil sections arranged in a fashion similar to that of U.S. Pat. No. 5,702,600 and U.S. Pat. No. 6,063,267, the disclosures of which are incorporated herein by reference. The coils are associated with different longitudinal sections of the pipe. That is, a first coil section is wound onto and along a bobbin and in turn extending along a first pipe section, a second coil section is wound on and along another bobbin itself extending along the a second pipe section, and third and fourth coil sections are wound on a third bobbin itself extending along a third pipe section, with the third coil section being wound on top of the forth coil section. The winding of the third and forth coil sections on top of one another, or otherwise in close association with one another, produces a winding capacitance between those two coils which forms all or part of the capacitance of a series resonant circuit in a coil assembly as described herein. Alternatively, the coils may be wound around the pipe, without the use of a bobbin.

In use, a fluid is passed through the pipe unit, and while the fluid passes therethrough, the AC power source and control circuitry generate low frequency electromagnetic fields and ringing pulses in the coil as described herein.

Due to the complexity of the process for producing the ringing pulses, the majority of this specification is devoted to the method and circuit associated with the generation of the ringing pulse. It should not be construed, however, that the process and equipment associated with the ringing pulse is of any greater importance than the process and equipment associated with the low frequency electromagnetic field.

As indicated above, the invention can be used with any cross-flow filtration system. Accordingly, the coils 620, 622 and/or 624 of reverse osmosis system 610 of FIG. 6, and the associated control circuitry therefor (FIG. 1), may be employed as well for microfiltration, ultrafiltration, and/or nanofiltration.

The terms "first," "second," and the like, herein do not denote any order, quantity, or importance, but rather are used to distinguish one element from another. In addition, the terms "a" and "an" herein do not denote a limitation of quantity, but rather denote the presence of at least one of the referenced item.

Although the invention has been described with reference to particular embodiments thereof, it will be understood by one of ordinary skill in the art, upon a reading and understanding of the foregoing disclosure, that numerous variations and alterations to the disclosed embodiments will fall within the spirit and scope of this invention and of the appended claims.

What is claimed is:

1. A method of treating a feed stream of fluid, comprising:
   flowing the feed stream to a cross-flow system comprising a first filter element, to yield a first permeate and a first retentate; and
   subjecting the feed stream to electromagnetic pulses
   providing the cross-flow system with a second filter element that yields a second permeate and a second retentate;
   flowing the first retentate as a second feed stream to the second filter element to yield a second permeate and a second retentate; and
   subjecting the second feed stream to second electromagnetic pulses at a position between the first and second filter elements.

2. The method of claim 1, comprising:
   providing a coil assembly in proximity to the feed stream;
   providing to the coil assembly an AC power source having a period including a first half-cycle of one polarity and a second half cycle of a polarity opposite to that of the first half-cycle;
   conducting current from the AC power source in a first loop comprising the AC power source, the coil assembly and a first switch during at least a portion of a first half-cycle of the AC power source period, and opening the first switch during a second half-cycle of the AC power source period; and
   during the second half-cycle of the AC power source, performing a subroutine of producing at least a first large ringing pulse in the coil assembly.

3. The method of claim 2, wherein the subroutine comprises, before the first large ringing pulse substantially decays, producing a second large ringing pulse in the coil assembly.

4. The method of claim 3, comprising producing the second large ringing pulse before the first ringing pulse decays by about 50% of its initial magnitude.

5. The method of claim 4, comprising producing a plurality of sequential ringing pulses during the second half-cycle of the AC power source, wherein a plurality of ringing pulses are each produced before a ringing pulse prior thereto substantially decays.

6. The method of claim 2, wherein producing at least a first ringing pulse in the coil assembly comprises closing and opening a second switch, the second switch being in a second loop with the coil assembly.

7. The method of claim 6, wherein said first switch is a silicon controlled rectifier (SCR).

8. The method of claim 6, wherein the second switch is electrically connected generally in parallel with the SCR.

9. The method of claim 8, wherein the second switch comprises a MOSFET.

10. The method of claim 7, wherein controlling the first switch includes sending a trigger signal to a gate of the SCR and thereupon removing the trigger signal from the gate after the SCR becomes conductive.

11. The method of claim 10, wherein sending a trigger signal includes activating an optical relay to pass the trigger signal to the gate of the SCR and thereafter deactivating the optical relay to remove the trigger signal from the gate of the SCR.

12. The method of claim 7, further comprising completing a predetermined number of cycles of the AC power signal upon start-up prior to conducting current through the first and second loops.

13. The method of claim 6, wherein the subroutine includes comparing the current in the coil assembly to a trigger value, and opening the second switch when the coil assembly voltage reaches the trigger value.

14. The method of claim 13, further comprising monitoring a temperature of the SCR, and thereupon discontinuing the conduction of current through the SCR when a temperature of the SCR exceeds a predetermined maximum value.

15. The method of claim 14, further comprising resuming controlled conduction of current through the SCR when a temperature of the SCR falls below the predetermined maximum value.

16. The method of claim 5, further comprising regulating a voltage of the large ringing pulse.

17. The method of claim 16, further comprising adjusting the voltage of the large ringing pulse so as to lie between a predetermined minimum value and a predetermined maximum value.

18. The method of claim 17, further comprising measuring AC power across the coil assembly upon start-up, and using the AC power upon start-up as an offset.

19. The method of claim 2, wherein the subroutine comprises permitting the first ringing pulse to substantially decay; and then producing, during said second half-cycle of the AC power source, a second large ringing pulse in said coil assembly.

20. The method of claim 19, comprising producing a plurality of sequential ringing pulses during the second half-cycle of the AC power source, wherein a plurality of ringing pulses are each produced after a ringing pulse prior thereto substantially decays.

21. The method of claim 2, comprising treating the feed steam with a large ringing pulse in each of a plurality of time intervals, each time interval having a duration corresponding to a portion of a cycle of a 50 or 60 Hz signal.

22. The method of claim 21, comprising treating the feed steam with a plurality of large ringing pulses in each of a plurality of time intervals, the time intervals being spaced in a way that corresponds to 50 or 60 Hz.

23. The method of claim 22, wherein each large ringing pulse after the first large ringing pulse within a time interval is initiated before the prior large ringing pulse substantially decays.

24. The method of claim 22, wherein each large ringing pulse after the first large ringing pulse within a time interval is initiated after the prior large ringing pulse substantially decays.

25. A method of treating a feed stream of fluid, comprising:
flowing the feed stream to a cross-flow system comprising a first filter element, to yield a first permeate and a first retentate and the cross-flow system further comprising a second filter element and a third filter element in staged relation to the first filter element;
subjecting the feed stream to first electromagnetic pulses
flowing the first retentate as a second feed stream to a second filter element to yield a second permeate and a second retentate;
flowing the second retentate as a third feed stream to the third filter element to generate a third permeate and an third retentate; and
subjecting at least one of:
the second feed stream to second electromagnetic pulses between the first and second filter elements; and
the third feed stream to third electromagnetic pulses between the second and third filter elements.

\* \* \* \* \*

UNITED STATES PATENT AND TRADEMARK OFFICE
CERTIFICATE OF CORRECTION

| | |
|---|---|
| PATENT NO. | : 8,273,251 B2 |
| APPLICATION NO. | : 11/900094 |
| DATED | : September 25, 2012 |
| INVENTOR(S) | : David Wayne Alley |

Page 1 of 1

It is certified that error appears in the above-identified patent and that said Letters Patent is hereby corrected as shown below:

Column 20, line 9, should read "third filter element to generate a third permeate and a"

Signed and Sealed this
First Day of January, 2013

David J. Kappos
*Director of the United States Patent and Trademark Office*